United States Patent
Hwang et al.

(10) Patent No.: US 11,188,163 B2
(45) Date of Patent: Nov. 30, 2021

(54) TOUCH DISPLAY DEVICE AND FABRICATION METHOD THEREOF

(71) Applicant: LG Display Co., Ltd., Seoul (KR)

(72) Inventors: JongHee Hwang, Gyeonggi-do (KR); KiDuk Kim, Gyeonggi-do (KR); BuYeol Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/727,283

(22) Filed: Dec. 26, 2019

(65) Prior Publication Data
US 2020/0233516 A1 Jul. 23, 2020

(30) Foreign Application Priority Data
Jan. 21, 2019 (KR) .................. 10-2019-0007357

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/323* (2013.01); *H01L 51/5206* (2013.01); *H01L 51/5221* (2013.01); *H01L 51/5237* (2013.01); *H01L 51/5293* (2013.01); *G06F 2203/04103* (2013.01)

(58) Field of Classification Search
CPC ......... G06F 3/0412; G06F 2203/04103; H01L 27/323; H01L 51/5206; H01L 51/5221; H01L 51/5237; H01L 51/5293
See application file for complete search history.

(56) References Cited

U.S. PATENT DOCUMENTS

| | | | |
|---|---|---|---|
| 2014/0049522 A1* | 2/2014 | Mathew | H01L 51/5281 345/204 |
| 2014/0098058 A1* | 4/2014 | Baharav | G06F 3/0416 345/174 |
| 2017/0010720 A1* | 1/2017 | Nakayama | G06F 3/0445 |
| 2017/0372113 A1* | 12/2017 | Zhang | G06K 9/2036 |
| 2018/0026079 A1* | 1/2018 | Lee | H01L 27/323 257/40 |
| 2018/0095584 A1* | 4/2018 | Lee | H01L 27/3213 |
| 2018/0150671 A1* | 5/2018 | Choo | G06F 3/0412 |
| 2019/0087630 A1* | 3/2019 | Seo | G06K 9/00053 |
| 2019/0147213 A1* | 5/2019 | Yeke Yazdandoost | G06K 9/0004 382/124 |

* cited by examiner

*Primary Examiner* — Stephen G Sherman
(74) *Attorney, Agent, or Firm* — Polsinelli PC

(57) ABSTRACT

A touch display device comprises a display panel including a plurality of light-emitting diodes respectively including an anode electrode and a cathode electrode; a touch sensor disposed at a first area of the display panel; a light-emitting element disposed on the cathode electrode at a second area of the display panel; and a light-receiving sensor disposed on a rear surface of the display panel.

15 Claims, 21 Drawing Sheets

TOUCH DISPLAY DEVICE AND FABRICATION METHOD THEREOF

CROSS REFERENCE TO RELATED APPLICATION

This application claims priority from Korean Patent Application No. 10-2019-0007357, filed on Jan. 21, 2019, which is hereby incorporated by reference in its entirety.

BACKGROUND

Field of the Disclosure

Aspects relate to a touch display device and a fabrication method thereof.

Description of the Background

With the development of the information society, demand for a variety of types of display devices for displaying images is increasing. In this regard, display devices, such as liquid crystal display (LCD) devices, and organic light-emitting diode (OLED) display devices, have been provided.

In addition, display devices can operate in response to an input signal received through various input devices such as a touch panel, a keyboard, a mouse, and the like. The touch panel of the display device allows a user to intuitively and conveniently input commands to the display device by touching a screen. The touch panel is disposed on the screen of the display device. A user can input a command to the display device by touching a specific point on the screen of the display device. In addition, the touch panel is built into the display device and integrated with the display device. A touch panel integrated with a display device may be known as a touch sensor, and a display device including a touch sensor may be known as a touch display device.

Such a touch display device is employed in smartphones. Each of smartphones may be provided a plurality of sensors to perform various applications. However, a non-pixel area of a screen may be widened due to the arrangement of the sensor.

SUMMARY

Various aspects of the present disclosure provide a touch display device having a structure able to implement a narrow bezel, and a fabrication method thereof.

Also provided is a touch display device having a structure able to implement various applications by increasing yield, and a fabrication method of the touch display device having the same.

According to an aspect, a touch display device comprises a display panel including a plurality of light-emitting diodes respectively including an anode electrode and a cathode electrode; a touch sensor disposed at a first area of the display panel; a light-emitting element disposed on the cathode electrode at a second area of the display panel; and a light-receiving sensor disposed on a rear surface of the display panel.

According to another aspect, disclosed is a method of fabricating a touch display device, wherein the touch display device includes a light-emitting element, and a light-receiving sensor, and a substrate on which an organic light-emitting diode having an anode electrode and a cathode electrode is disposed, the method comprises providing an encapsulation layer on the substrate; providing first and second electrodes on the encapsulation layer; disposing the light-emitting element on the first and second electrodes; and disposing the light-receiving sensor on a rear surface of the substrate.

According to a further aspect, a touch display device comprises a display panel including a plurality of light-emitting diodes each including an anode electrode and a cathode electrode; an encapsulation layer disposed on the cathode electrode a touch sensor including a first touch electrode line disposed on the encapsulation layer, an insulation film disposed on the first touch electrode line, and a second touch electrode line disposed on the insulation film, and the touch sensor disposed at a first area of the display panel; a light-emitting element disposed on the cathode electrode at a second area of the display panel; and a light-receiving sensor disposed on a rear surface of the display panel The present disclosure provides the touch display device having structure able to implement a narrow bezel, and the fabrication method thereof.

The present disclosure provides the touch display device having structure able to implement various applications by increasing yield, and the fabrication method thereof.

DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
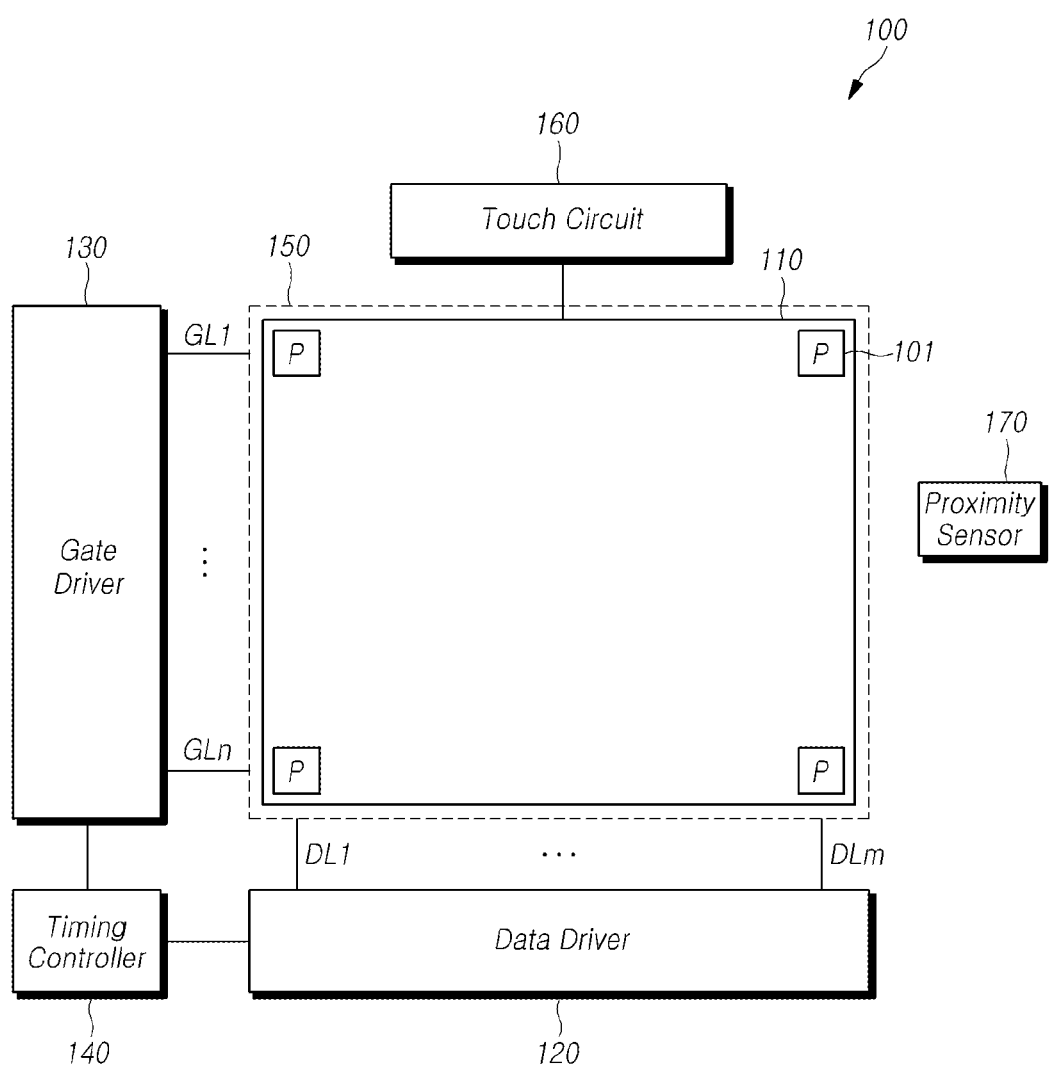
FIG. 1 is a schematic view illustrating a structure of a touch display device according to the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. In addition, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a structure of a touch display device according to aspects.

Referring to FIG. 1, the touch display device 100 may include a display panel 110, a data driver 120, a gate driver 130, a timing controller 140, a touch sensor 150, a touch circuit 160, and a proximity sensor 170.

The display panel 110 may display an image. The display panel 110 may include a pixel area and a non-pixel area. The pixel area may be an area in which an image is displayed, while the non-pixel area may be an area in which wirings transmitting at least one of a signal, a voltage, or a combination thereof, to the pixel area, are disposed.

The display panel 110 may include a plurality of gate lines GL1 to GLn extending in a first direction and a plurality of data lines DL1 to DLm extending in a second direction. While the first and second directions intersect each other, aspects are not limited thereto. The display panel 110 may include a plurality of pixels 101 provided corresponding to an area in which the plurality of gate lines GL1 to GLn and the plurality of data lines DL1 to DLm intersect each other. The plurality of pixels 101 may include an organic light-emitting diode (not shown) and a pixel circuit (not shown) for supplying a driving current to the organic light-emitting diode. The pixel circuit may be connected to the gate lines GL1 to GLn and the data lines DL1 to DLm to supply a driving current to the organic light-emitting diodes. Here, lines disposed in the display panel 110 are not limited to the plurality of gate lines GL1 to GLn and the plurality of data lines DL1 to DLm.

The data driver 120 may apply a data signal to the plurality of data lines DL1 to DLm. The data signal may correspond to the gradation, and a voltage level of the data signal may be determined according to the gradation. The voltage of the data signal may be referred to as a data voltage.

Here, although the data driver 120 is illustrated as being a single data driver, the present disclosure is not limited thereto. Two or more data drivers may be provided, depending on the size and resolution of the display panel 110. In addition, the data driver 120 may be implemented as an integrated circuit.

The gate driver 130 may apply a gate signal to the plurality of gate lines GL1 to GLn. The pixel 101 corresponding to the plurality of gate lines GL1 to GLn to which the gate signal is applied may receive the data signal. In addition, the gate driver 130 may transfer a sensing signal to the pixel 101.

The pixel 101, having received the sensing signal output from the gate driver 130, may receive a sensing voltage output from the data driver 120. Here, although the gate driver 130 is illustrated as being a single gate driver, the present disclosure is not limited thereto. At least two gate drivers may be provided. In addition, the gate drivers 130 may be disposed on both sides of the display panel 110, respectively, such that one of the gate drivers 130 is connected to the odd-numbered gate lines among the plurality of gate lines GL1 to GLn, and the other of the gate drivers 130 may be connected to even-numbered gate lines among the plurality of gate lines GL1 to GLn. However, the present disclosure is not limited thereto. The gate driver 130 may include a gate signal generating circuit, and a level shifter applying at least one of a signal, a voltage, or a combination thereof, to the gate signal generating circuit. The gate signal generating circuit may be disposed on the display panel 110.

The timing controller 140 may control the data driver 120 and the gate driver 130. In addition, the timing controller 140 may transfer image data, corresponding to the data signal, to the data driver 120. The image data may be a digital signal. The timing controller 140 may correct the image signal and transfer the corrected image signal to the data driver 120. The operation of the timing controller 140 is not limited thereto. The timing controller 140 may be implemented as an integrated circuit.

The touch sensor 150 may be disposed on a first area of the display panel 110. The first area may include the pixel area and a portion of the non-pixel area. The touch sensor 120 may output a touch sensing signal corresponding to a touch point of the display panel 110 touched by the user's finger, a pen, or the like. The touch event detected by the touch sensor 120 may mean direct contact with one point of the display panel 110 of the touch display device 10. However, the present disclosure is not limited to this. For example, the touch event may include an indirect contact event in which the touch sensor 120 to sense a change in the electrostatic capacity at a predetermined distance from the display panel 110.

The touch circuit 160 may receive the touch sensing signal transmitted from the touch sensor 150 and calculate the position of the touch point. The touch circuit 160 may transmit a touch driving signal to the touch sensor 150. The touch circuit 160 may transmit position information on the calculated touch point to a set. The set may be a micro control unit (MCU). In addition, the set may be an application processor (AP). However, the present disclosure is not limited thereto.

The proximity sensor 170 may measure the quantity of external light radiated to the display panel 110. In addition, the proximity sensor 170 may detect an object in proximity to the touch display device 100. The proximity sensor 170 may measure the quantity of external light by sensing the quantity of visible light, and may detect the object in proximity to the touch display device by sensing infrared (IR) radiation. In this regard, the proximity sensor 170 may include a light-emitting element (not shown) and a light-receiving sensor (not shown).

The light-emitting element may emit IR radiation, and the light-receiving sensor may sense IR radiation and visible light, respectively. Infrared radiation may have a wavelength range of 850 to 950 nm and visible light may have a wavelength range of 525 to 560 nm. In addition, the light-receiving sensor may sense IR radiation emitted from the light-emitting element and reflected by an external object. Here, while the light-emitting element and the light-receiving sensor of the proximity sensor 170 are illustrated as being incorporated into a single component, the present disclosure is not limited thereto. The light-emitting element and the light-receiving sensor may be disposed separately in the touch display device 100. The light-emitting element may be disposed on a second area of the display panel 110. The second area may be a portion of the non-pixel area, other than the portion of the non-pixel area in the first area in which the touch sensor 150 is disposed. The touch sensor 150 may not be disposed in the second area.

The proximity sensor 170 may receive a control signal from an external set. In addition, the proximity sensor 170 may transmit the sensed signal to the set. However, the present disclosure is not limited thereto.

Figure 2:
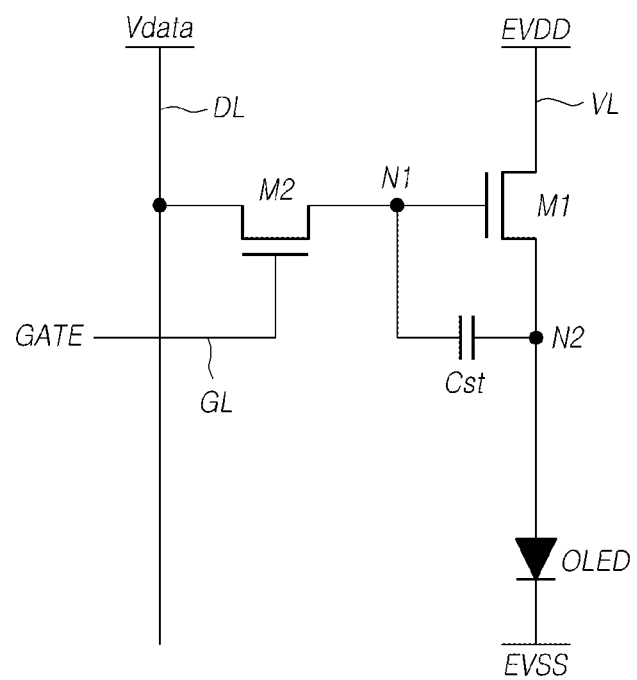
FIG. 2 is a circuit diagram illustrating an aspect of a pixel illustrated in FIG. 1.

FIG. 2 is a circuit diagram illustrating an aspect of the pixel illustrated in FIG. 1.

Referring to FIG. 2, the pixel 101 may include an organic light-emitting diode (OLED) and a pixel circuit for driving the OLED. The pixel circuit may include a first transistor M1, a second transistor M2, and a capacitor Cst.

The first transistor M1 has a first electrode connected to a first power supply line VL1, through which power from a first power source EVDD is transferred, a gate electrode connected to a first node N1, and a second electrode connected to a second node N2. The first transistor M1 may cause a current to flow to the second node N1, in response to a voltage being transferred to the second node N2. The first electrode of the first transistor M1 may be a drain electrode and the second electrode may be a source electrode. However, the present disclosure is not limited thereto.

The current flowing to the second node N2 may correspond to the following Equation 1:

$$Id = k(V_{GS} - Vth)^2 \quad (1),$$

where Id denotes the amount of current flowing through the second node N2, k denotes electron mobility of the transistor, $V_{GS}$ denotes a voltage difference between the gate electrode and the source electrode of the first transistor M1, and Vth denotes a threshold voltage of the first transistor M1.

The second transistor M2 has a first electrode connected to the data line DL, a gate electrode connected to the gate line GL, and a second electrode connected to a first node N1. Thus, the second transistor M2 may generate a data voltage Vdata, corresponding to the data signal to the first node N1, in response to a gate signal GATE being transferred through the gate line GL. The first electrode of the second transistor M2 may be a drain electrode and the second electrode may be a source electrode. However, the present disclosure is not limited thereto.

The capacitor Cs may be connected between the first node N1 and the second node N2. The capacitor Cs may maintain the voltages of the gate electrode and the source electrode of the first transistor M1 constant.

The organic light-emitting diode OLED may have an anode electrode connected to the second node N2 and a cathode electrode connected to a second power source EVSS. Here, the second power source EVSS may supply a voltage lower than a voltage level of the first power source EVDD. The second power source EVSS may be a ground voltage. However, the present disclosure is not limited thereto. When an electric current flows from the anode electrode to the cathode electrode, the organic light-emitting diode (OLED) may emit light depending on the amount of current. The OLED may emit light of any one of red, green, blue, and white. However, the present disclosure is not limited thereto.

The pixel circuit employed in the touch display device 100 of FIG. 1 is not limited thereto.

Figure 3:
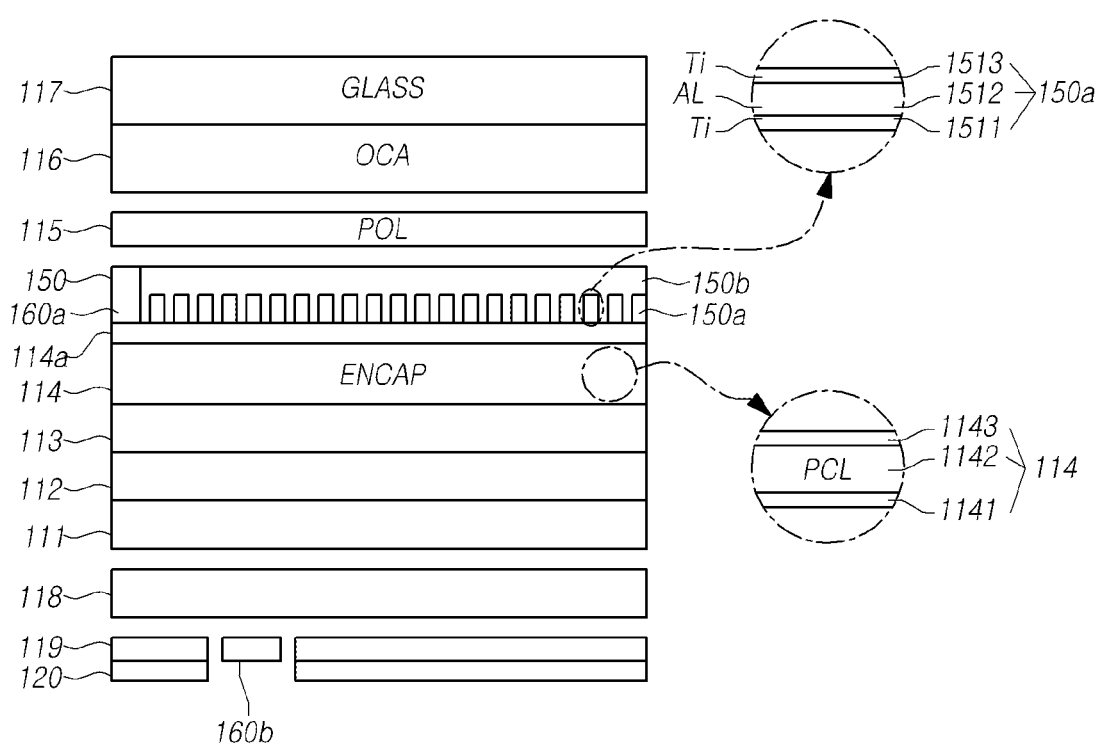
FIG. 3 is a cross-sectional view illustrating an aspect of the touch display device illustrated in FIG. 1.

FIG. 3 is a cross-sectional view illustrating an aspect of the touch display device illustrated in FIG. 1.

Referring to FIG. 3, the touch display device 100 may include: a substrate 111; an element layer 112 disposed on the substrate 111 and having transistors and a capacitor illustrated in FIG. 2; an anode electrode disposed on the element layer 112; a light-emitting layer 113 including a luminescent material layer disposed on the anode electrode, a bank disposed on the element layer 112, and a cathode electrode disposed on the luminescent material layer and the bank; an encapsulation layer 114 disposed on the light-emitting layer 113; a touch sensor 150 disposed on the encapsulation layer 114; a polarization film 115 disposed on the touch sensor 150; an adhesive layer 116 disposed on the polarization film 115; and a glass cover 117 disposed on the adhesive layer 116. The adhesive layer 116 may comprise an optical clear adhesive (OCA). However, the present disclosure is not limited thereto.

A light-emitting element 160*a* may be disposed above the cathode electrode of the light-emitting layer 113. The light emitted from the light-emitting element 160*a* may travel toward the glass cover 117 without passing through the cathode electrode. Then, the light may be reflected by an object disposed on the glass cover 117, and then directed again toward the interior of the touch display device 100. Thus, when the light emitted from the light-emitting element 160*a* is received by the light-receiving sensor 160*b*, the light may pass through the cathode electrode only once.

A back plate 118 may be disposed on the rear surface of the substrate 111. The light-receiving sensor 160*b* may be disposed below the back plate 118. The back plate 118 may be made of a transparent material allowing light to pass therethrough. In addition, a foam pad 119 and a heat sink 120 may be disposed on a bottom surface of the back plate 118. The light-receiving sensor 160*b* may be disposed on a portion of the bottom surface of the back plate 118, from which a portion of the foam pad 119 and a portion of the heat sink 120 are removed. The heat sink 120 may comprise copper. However, the present disclosure is not limited thereto.

In addition, the light-emitting element 160*a* may be disposed on the encapsulation layer 114. A power line (not shown) supplying power to the light-emitting element 160*a* may be disposed concurrently when the touch sensor 150 is disposed on the encapsulation layer 114. Then, a planarization film may be disposed on the encapsulation layer 114.

The substrate 111 may comprise at least one of polyethylene terephthalate (PET), polyamide, or a combination thereof. The element layer 112 may include a conductive layer and an insulation film for forming a transistor and a capacitor. The conductive layer may comprise a metal material, so that the conductive layer has low light transmittance. However, the insulation film may comprise a material having high light transmittance. The metal material may be, but is not limited to, a low work function material, such as calcium (Ca), aluminum (Al)/lithium (Li), or magnesium (Mg)/silver (Ag).

In addition, the anode electrode of the light-emitting layer 113 may comprise a metal material. The anode electrode of the light-emitting layer 113 and conductive layer of the element layer 112 may be disposed in a specific position between the conductive layers. The aperture ratio of the pixel area AA may be determined in accordance with the ratio of the area of the pixel area AA in which the conductive layer and the anode electrode are disposed to the area of the pixel area AA in which the conductive layer and the anode electrode are not disposed. That is, the transmittance of the touch display device 100 may be determined by the aperture ratio of the element layer 112 and the anode electrode.

The light-emitting layer 113 disposed on the anode electrode may have high transmittance because the light-emitting layer 113 include light-permeable material. In contrast, the cathode electrode may be disposed on the front surface of the pixel area AA and the cathode electrode has low transmittance, because may include a metal material. The encapsulation layer 114, the polarization film 115, the adhesive layer 116, and the glass cover 117, disposed on the cathode electrode, have high transmittance because they comprise a material allowing light to pass therethrough. That is, the transmittance of cathode electrode, the element layer, and the anode electrode may affect the transmittance of the touch display device 100.

The encapsulation layer 114 may encapsulate the light-emitting layer 113. The encapsulation layer 114 may include a first inorganic film 1141, an organic film 1142, and a second inorganic film 1143. The thickness of the organic film 1142 may be thicker than the thickness of the first inorganic film 1141 and the second inorganic film 1143. In addition, a touch buffer layer 114a may be disposed on the encapsulation layer 114. The touch buffer layer 114a may prevent the encapsulation layer 114 from being damaged in a process of disposing the touch sensor 150 on the encapsulation layer 114.

The touch sensor 150 may include a touch electrode line 150a. The touch electrode line 150a may be formed by stacking three layers of metal 1511, 1512, and 1513. That is, the three layers of metal 1511, 1512, and 1513 of the touch electrode line 150a may be a titanium (Ti) layer, an aluminum (Al) layer, and a titanium (Ti) layer. However, the material constituting the touch electrode line 150a is not limited thereto. In addition, the touch sensor 150 may include a passivation film 150b disposed on the touch electrode line 150a. The upper portion of the touch sensor 150 may be planarized by the passivation film 150b.

Since the cathode electrode may have low transmittance and the transmittance of the element layer may be influenced by the aperture ratio as described before, when light, emitted from the light-emitting element 160a, passes through the element layer 112 and the cathode electrode of the light-emitting layer 113, and is reflected by an object, disposed on the glass cover 117, and passes again through the cathode electrode of the light-emitting layer 113 and the element layer 112, the amount of light received by the light-receiving sensor 160b may be considerably reduced. As a result, the light-receiving sensor 160b may not detect an object in proximity to the touch display device.

However, when the light-emitting element 160a is disposed on the cathode electrode, light emitted from the light-emitting element 160a may be directed toward the glass cover 117 without passing through the cathode electrode, and reflected by the object toward the light-receiving sensor 160b. As a result, the amount of light received by the light-receiving sensor 160b is increased, so that the proximity of an object may be perceived more easily. Accordingly, the light-emitting element 160a may be disposed on the same layer as the touch sensor 150.

When the height of the light-emitting element 160a is higher than the upper end of the passivation film 150b of the touch electrode line 150a, a portion of the polarization film 115 disposed on the passivation film 150b may be removed, thereby forming an area in which the polarization film 115 is not disposed on the light-emitting element 160a. The light-emitting element 160a and the light-receiving sensor 160b may correspond to the proximity sensor 170 as illustrated in FIG. 1.

Figure 4:
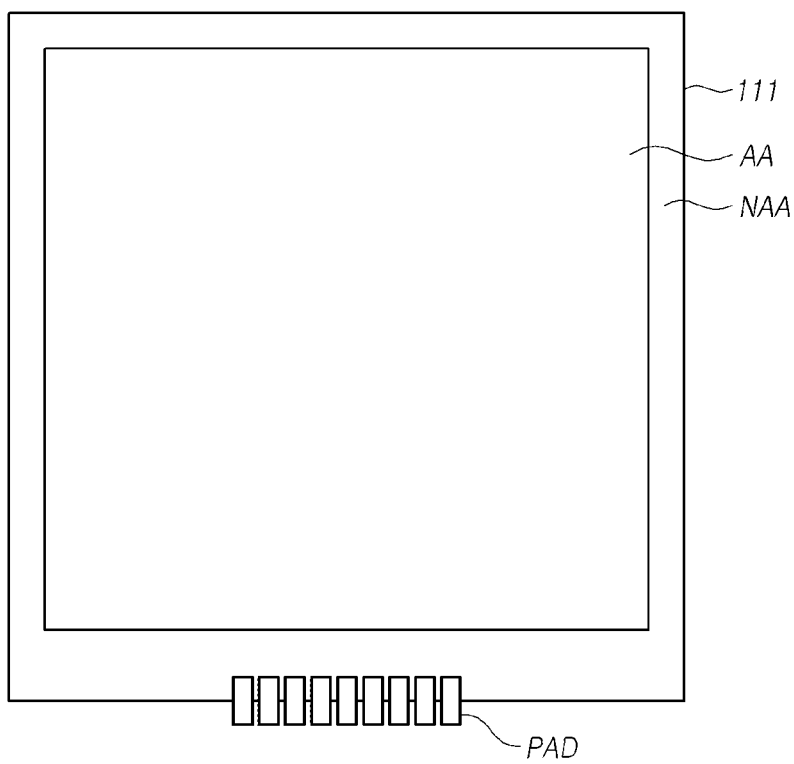
FIG. 4 is a top view illustrating a display panel according to the present disclosure.
Figure 5:
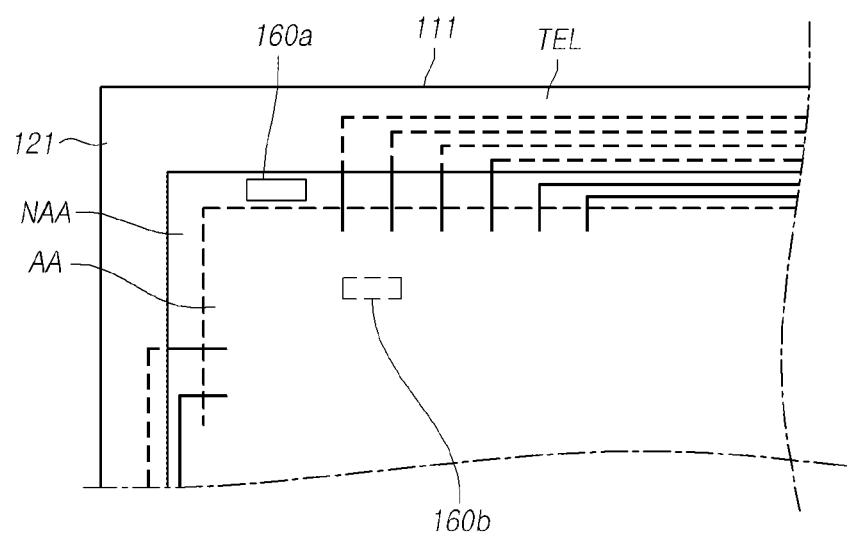
FIG. 5 is an enlarged view illustrating a boundary portion between a pixel area and a non-pixel area in the display panel.

FIG. 4 is a top view illustrating a display panel according to aspects, and FIG. 5 is an enlarged view illustrating a boundary portion between a pixel area and a non-pixel area in the display panel.

Referring to FIGS. 4 and 5, the display panel 110 may include a substrate 111 on which a pixel area AA and a non-pixel area NAA are provided. The non-pixel area NAA may be disposed around the periphery of the pixel area AA.

The pixel area AA may be provided with the plurality of pixels 101, illustrated in FIG. 1, so that an image can be displayed in the pixel area in response to the operation of the pixels 101. The plurality of data lines DL1 to DLm and the plurality of gate lines GL1 to GLn may be disposed in the pixel area AA to transmit a data signal and a gate signal to the pixels 101. In addition, the touch sensor 150 illustrated in FIG. 1 may be disposed in the pixel area AA.

A plurality of touch lines TELs connecting the touch sensor 150 and pads PAD may be disposed in the non-pixel area NAA. A portion of the non-pixel area NAA may be shielded by a housing 121 through which light does not pass. Wirings disposed in the non-pixel area NAA and connected to the pads PAD are not limited to the touch lines TEL. In the non-pixel area NAA, a gate signal generating circuit (not shown) applying a gate signal to the gate lines GL1 to GLn may be disposed. Here, the density of touch wirings including the touch lines TEL may vary in each portion of the non-pixel area NAA.

A high density area may be an area in which a greater number of the wirings are provided than in the other areas In the high density area, some of wirings are not shielded by the housing 121, so that some of the touch electrode lines TELs may not be disposed below the housing 121. Here, the touch electrode lines TEL shielded by the housing are indicated by dotted lines in the area in which the housing 121 is disposed. On the other hand, in an area in which the density of wirings is low, a portion in which none of the touch electrode lines TEL are disposed may be present between the housing 121 and the pixel area AA.

The light-emitting element 160a may be disposed in the non-pixel area NAA in a portion in which the touch electrode line TEL is not disposed between the housing 121 and the pixel area AA, thereby allowing the light emitted from the light-emitting element 160a to be easily radiated outwardly. In addition, since the light emitted from the light-emitting element 160a is not radiated on the touch electrode line TEL, the touch electrode line TEL can be prevented from generating noise. In contrast, the light-receiving sensor 160b may be disposed in a location corresponding to the pixel area AA. The light-receiving sensor 160b may be disposed on the rear surface of the display panel 110 in a location corresponding to the pixel area AA. The light-receiving sensor 160b is indicated by a dotted line to indicate that light-receiving sensor 160b is disposed on the rear surface of the display panel 110.

Figure 6:
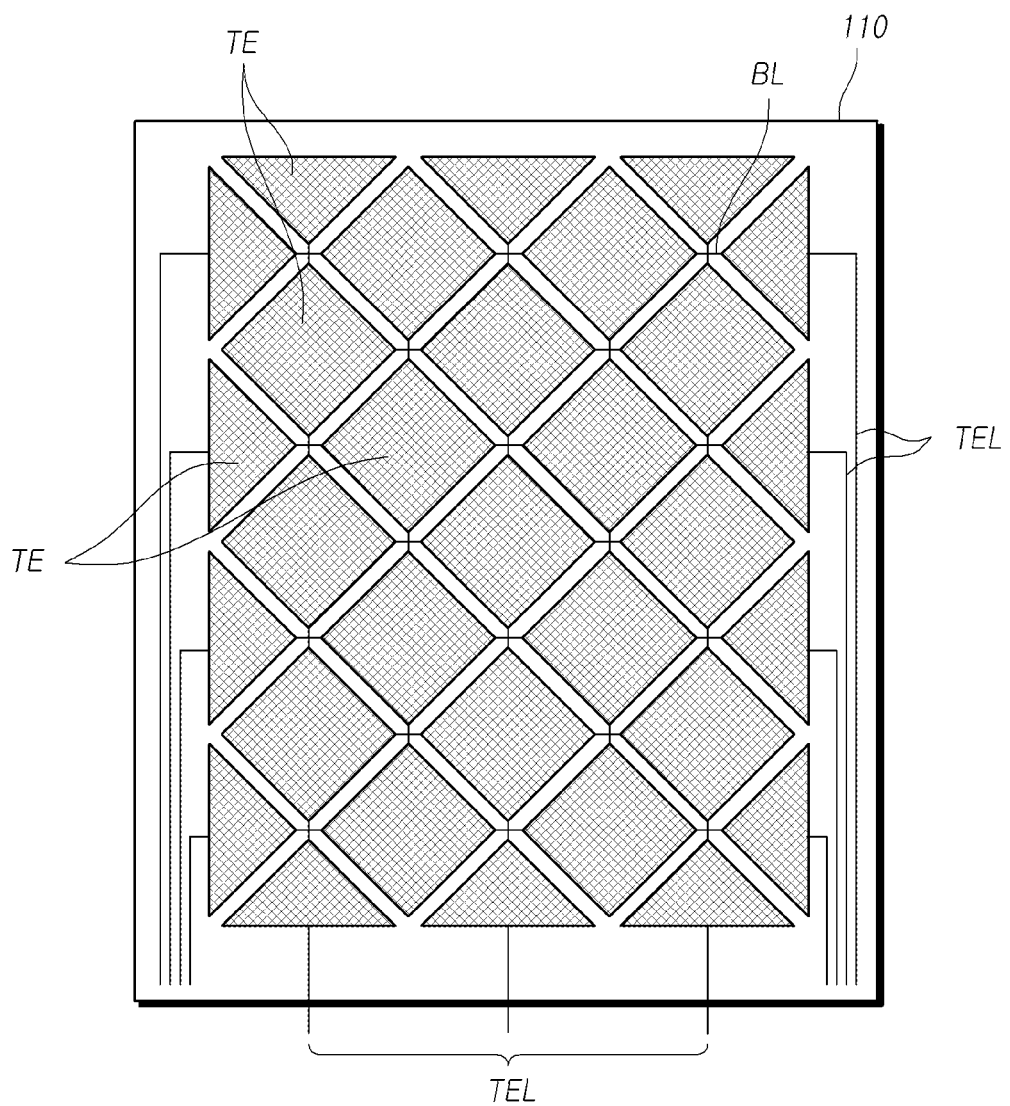
FIG. 6 is a top view illustrating a touch sensor according to the present disclosure.

FIG. 6 is a top view illustrating a touch sensor according to aspects.

Referring to FIG. 6, the touch sensor may be disposed on the display panel 110 and may include a plurality of touch electrodes TE. Some of the plurality of touch electrodes may be referred to as touch driving electrodes and the remaining touch electrodes may be referred to as touch sensing electrodes. The plurality of touch electrodes TE may be connected together in rows by connecting portions BL to provide a plurality of electrode rows, and some of the plurality of touch electrodes TE may be connected together in columns by connecting portions BL to provide a plurality of electrode columns. Here, although the plurality of touch electrodes TE are illustrated as being arrayed in a 4×3 matrix, the number of the plurality of touch electrodes TE is not limited to thereto. The plurality of touch electrodes TE may be provided on the same layer on the display panel 110. However, the present disclosure is not limited thereto. In addition, touch lines TEL may be disposed to transmit a touch signal to the touch electrodes TE.

The connecting portion BL may connect one touch electrode TED to another touch electrode. The connection portions BL may intersect with each other such that the connecting portions may be disposed on different layers, respectively, in order not to be connected to each other. The connecting portions BL may be disposed on different layers from the touch electrodes TE and may be connected to specific touch electrodes TE through via connections. The touch electrode TE may be formed by patterning a conductive metal layer. In addition, the touch electrode TE may comprise a transparent material such as indium tin oxide (ITO). In addition, the patterned touch electrode TE may have a mesh shape in which a plurality of open areas is formed. Light, emitted from the display panel 110, may pass through the ITO touch electrode TE, or through open areas of the touch electrode TE. The touch line TEL and the connecting portion BL may be referred to as a first touch electrode line, and the patterns of the touch electrode TE provided in a mesh shape may be referred to as a second touch electrode line.

Figure 7:
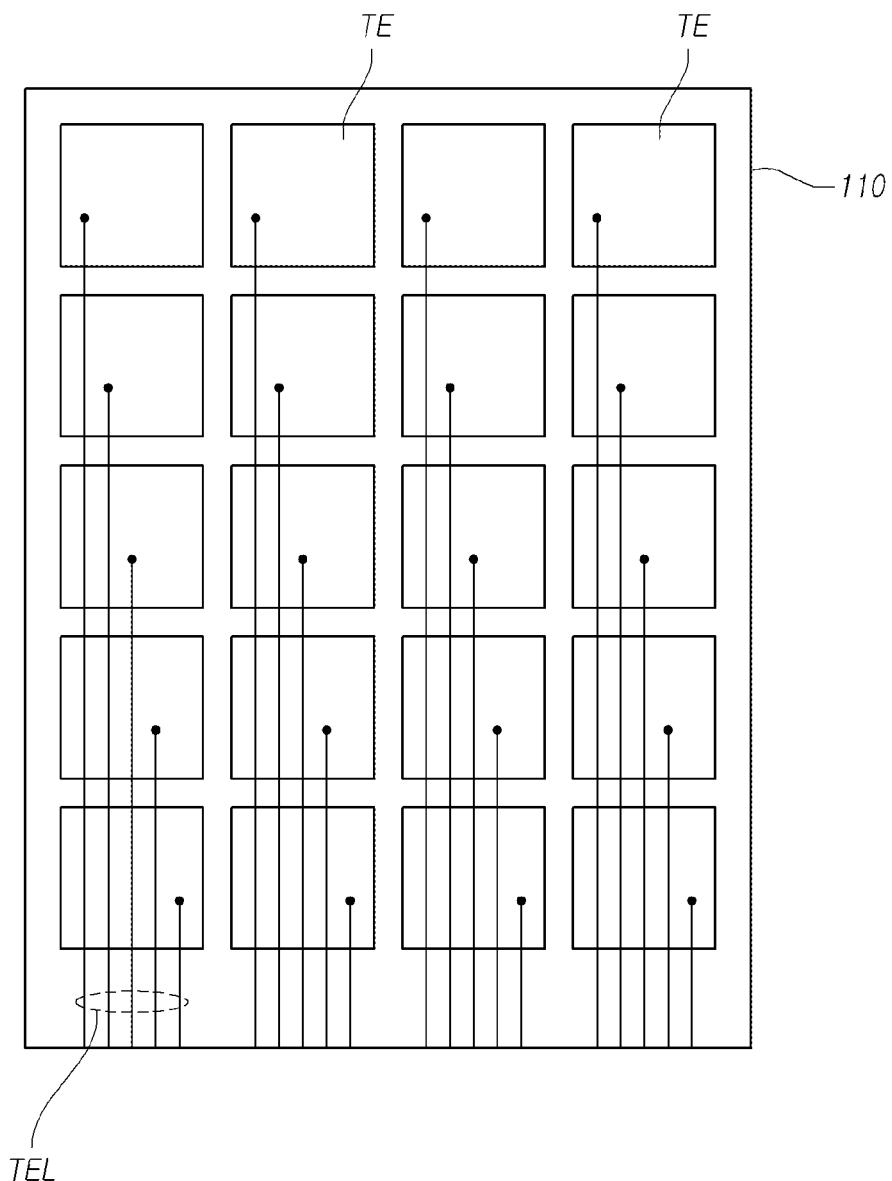
FIG. 7 is a top view illustrating a touch sensor according to the present disclosure.

FIG. 7 is a top view illustrating a touch sensor according to aspects.

Referring to FIG. 7, the touch sensor may include a plurality of touch electrodes TE. The plurality of touch electrodes TE, each having a specified area, may be disposed on the display panel 110 in a 5×4 matrix. However, the number of the touch electrodes TE is not limited thereto. In addition, touch lines TEL may be connected to the respective touch electrodes TE. The touch line TEL may be disposed at a lower portion of the touch electrode such that the touch line may contact a portion of the touch electrode. The touch line TEL may transmit a touch driving signal to the touch electrode TE and may receive a touch sensing signal from the touch electrode TE. The touch electrode TE and the touch line TEL may be mounted in the display panel 110 so that the touch display device 100 does not include a separate touch panel on the display panel 110, thereby implementing a thinned display panel 110.

FIGS. 8A to 8E are conceptual diagrams illustrating a process of disposing the touch sensor illustrated in FIG. 6 on the display panel.

Figure 8A:
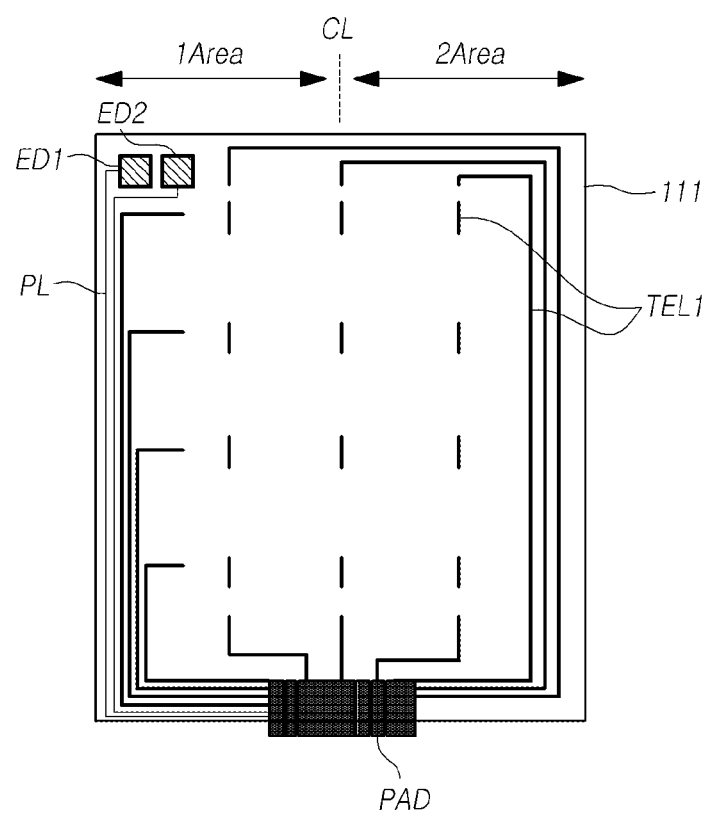
FIGS. 8A to 8E are conceptual diagrams illustrating a process of disposing the touch sensor illustrated in FIG. 6 on the display panel.

As illustrated in FIG. 8A, the first touch electrode line TEL1 may be disposed on the substrate 111. An encapsulation layer 114 may be disposed on the substrate 111. While the encapsulation layer 114 is illustrated as being disposed on the top surface of the substrate 111, the present disclosure is not limited thereto. The encapsulation layer 114 may be provided to cover the top surface and side surfaces connected to the top surface of the light-emitting layer disposed on the substrate 111. An organic light-emitting diode may be disposed on the light-emitting layer.

The first electrode and the second electrode may be disposed in an area of the substrate 111. The first touch electrode line TEL1 may include the connecting portion BL and the touch line TEL transmitting a touch signal to the touch electrode TE, illustrated in FIG. 6. Power lines PL supplying power to the first electrode ED1 and the second electrode ED2 may be disposed on the substrate 111.

The left area 1Area from a virtual center line CL of the upper edge of the substrate 111 may be an area in which the density of wirings is low, and the right area 2Area from the virtual center line CL may be an area in which the density of wirings is high. The first touch electrode line TEL1 may be disposed in the non-pixel area NAA, corresponding to the periphery of the substrate 111, so as to be connected to the pad PAD. In addition, the power lines PL may be disposed along the non-pixel area NAA to be connected to the pad PAD.

Figure 8B:
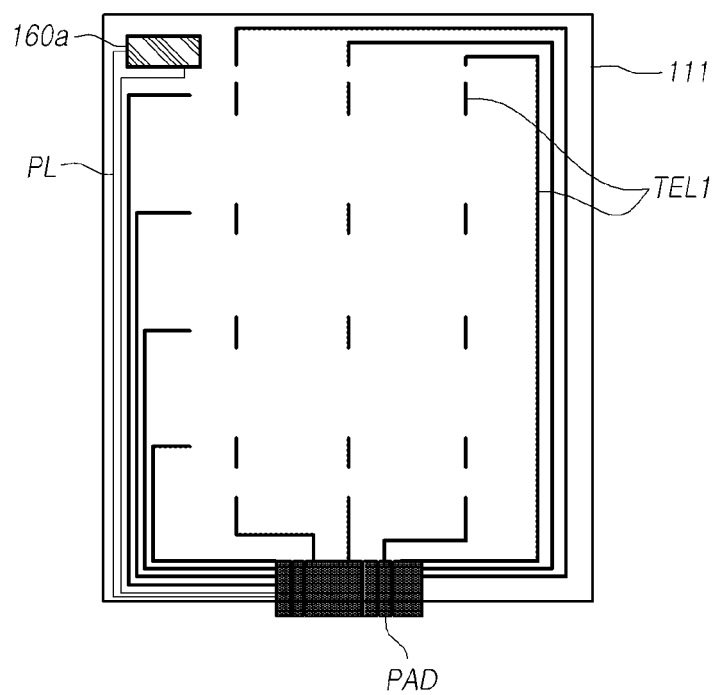

As illustrated in FIG. 8B, the light-emitting element 160*a* may be disposed in a location corresponding to the first electrode ED1 and the second electrode ED2. The light-emitting element 160*a* may include a p-type electrode connected to the first electrode ED1, and an n-type electrode connected to the second electrode ED2. However, the present disclosure is not limited thereto. The light-emitting element 160*a* may be disposed on the first electrode ED1 and the second electrode ED2 by a transfer process.

Figure 8C:
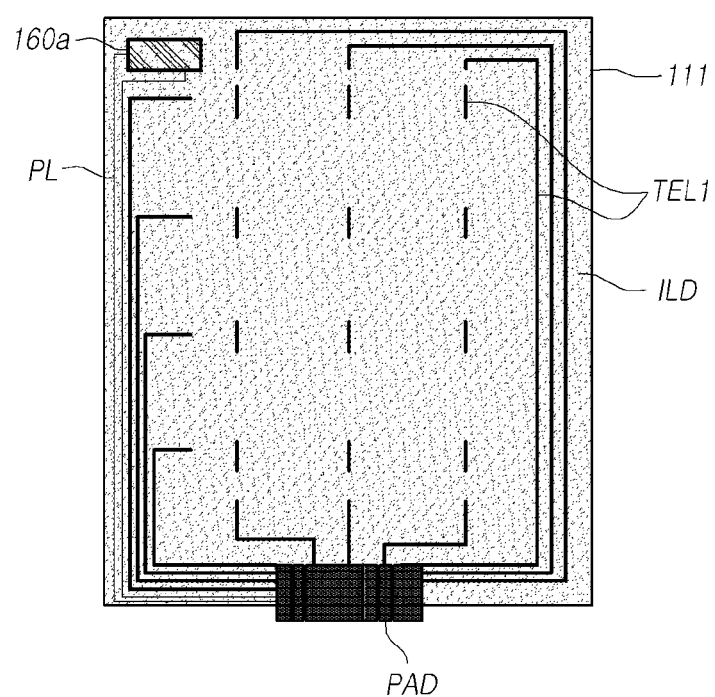
Figure 8D:
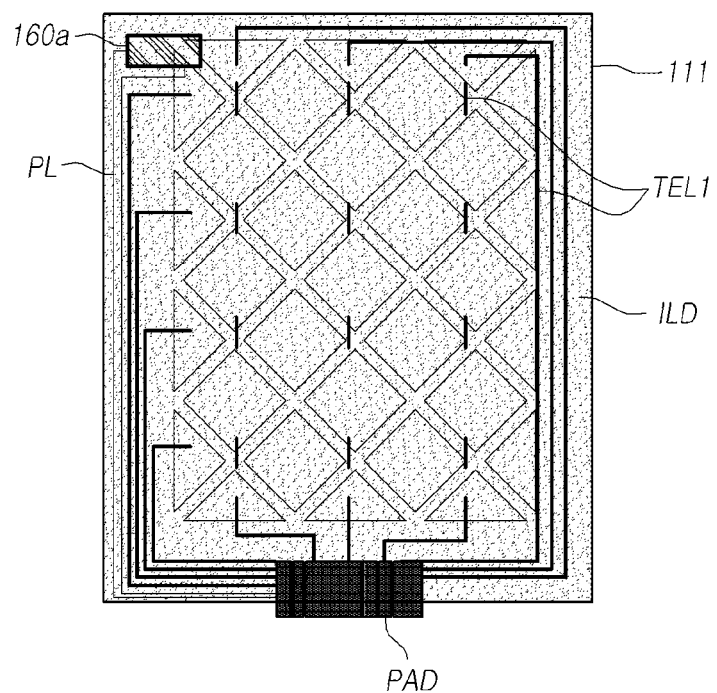

As illustrated in FIG. 8C, an insulation film ILD may be disposed on the encapsulation layer 114 on which the first touch electrode line TEL1 is disposed. The insulation film ILD may not be disposed over the light-emitting element 160*a*. As illustrated in FIG. 8D, a second touch electrode line TEL2 may be disposed on the insulation film ILD. The second touch electrode line TEL2 may correspond to the touch electrode TE illustrated in FIG. 6. However, the present disclosure is not limited thereto. The insulation film ILD may have a contact hole in a location corresponding to the connecting portion BL of FIG. 6. The second touch electrode line TEL2 may be connected to the connecting portion BL, disposed below the insulation film ILD, through the contact hole.

Figure 8E:
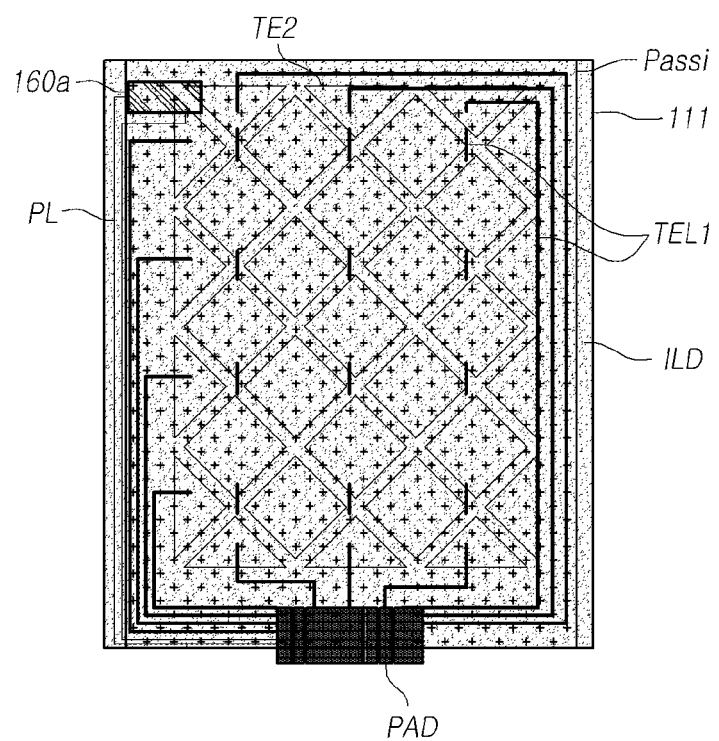

As illustrated in FIG. 8E, a planarization film Passi may be disposed on the second touch electrode line TEL2. The planarization film Passi may not be disposed on the light-emitting element 160*a*. Here, the planarization film Passi may be the passivation film 150*b* illustrated in FIG. 6.

Here, the locations, in which the first electrode ED1 and the second electrode ED2 are disposed, are not limited to the illustrated area. The locations may be provided in the area of the non-pixel area NAA in which the density of wirings, including the first touch electrode line TEL1, is low. In addition, the light-emitting element 160*a* may be disposed in the non-pixel area in which the touch electrode TE is not disposed.

FIGS. 9A to 9E are conceptual diagrams illustrating a process of disposing the touch sensor illustrated in FIG. 1 on the display panel.

Figure 9A:
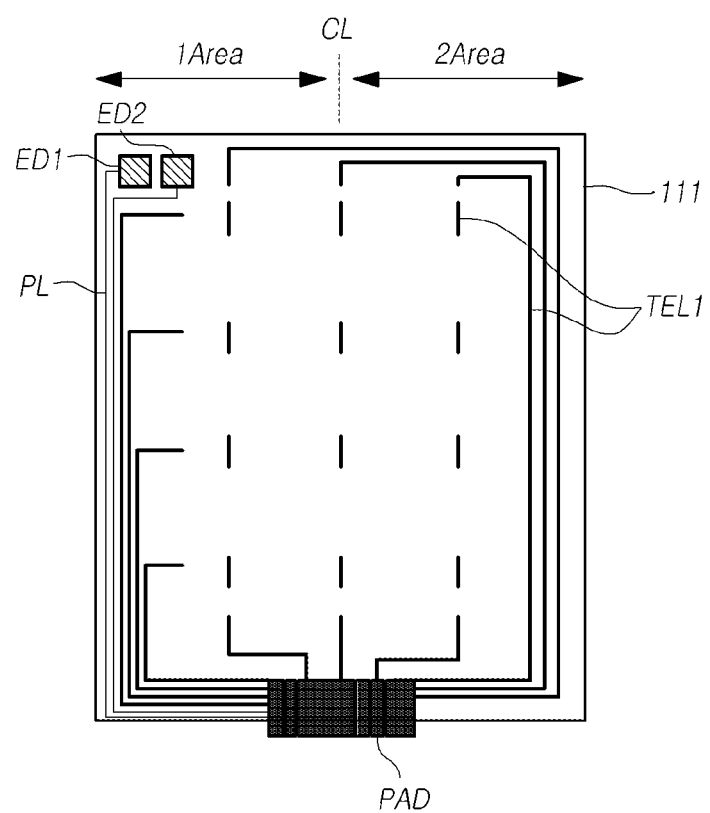
FIGS. 9A to 9E are conceptual diagrams illustrating a process of disposing the touch sensor illustrated in FIG. 1 on the display panel.

As illustrated in FIG. 9A, the first touch electrode line TEL1 may be disposed on the substrate 111. Here, an encapsulation layer 114 may be disposed on the substrate 111. The first electrode ED1 and the second electrode ED2 may be disposed in an area of the substrate 111. The first touch electrode line TEL1 may include a connecting portion BL illustrated in FIG. 6 and a touch line TEL transmitting a touch signal to the touch sensor 150. Power lines PL supplying power to the first electrode ED1 and the second electrode ED2 may be disposed on the substrate 111.

The first touch electrode line TEL1 and the power lines PL may be disposed in locations corresponding to the non-pixel area NAA. The left area 1Area from a virtual center line CL of the upper edge of the substrate 111 may be an area in which the density of wirings is low, and the right area 2Area from the virtual center line CL may be an area in which the density of wirings is high. The first touch electrode line TEL1 may be disposed along the periphery of the substrate 111 such that the first touch electrode line may be connected to the pad PAD. In addition, the power lines PL may be disposed along the non-pixel area NAA in the periphery of the substrate 111 so as to be connected to the pad PAD.

Figure 9B:
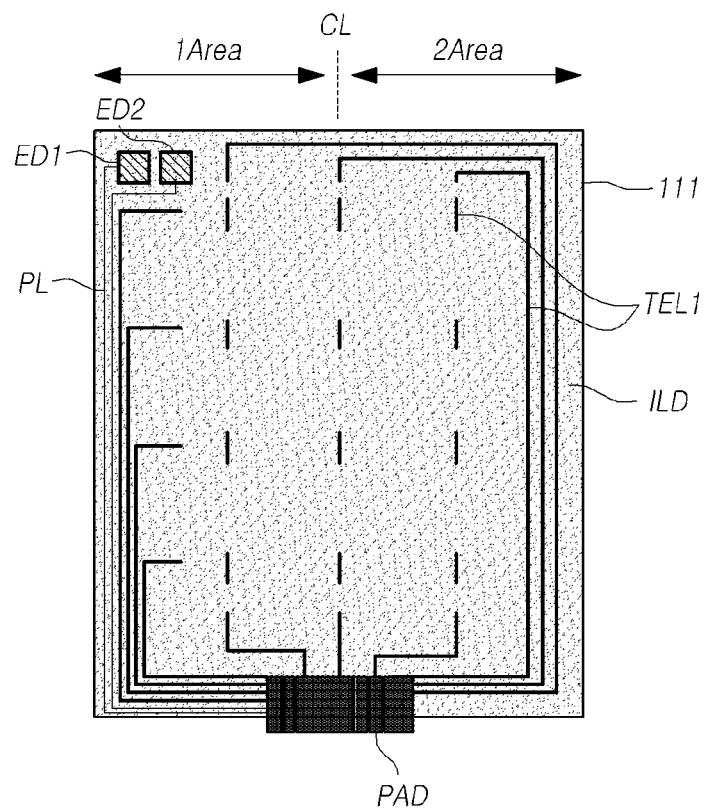

As illustrated in FIG. 9B, an insulation film ILD may be disposed on the encapsulation layer 114 on which the first touch electrode line TEL1, the first electrode ED1, the second electrode ED2, and the power lines PL are disposed. The insulation film ILD may not be disposed over the first electrode ED1 and the second electrode ED2.

Figure 9C:
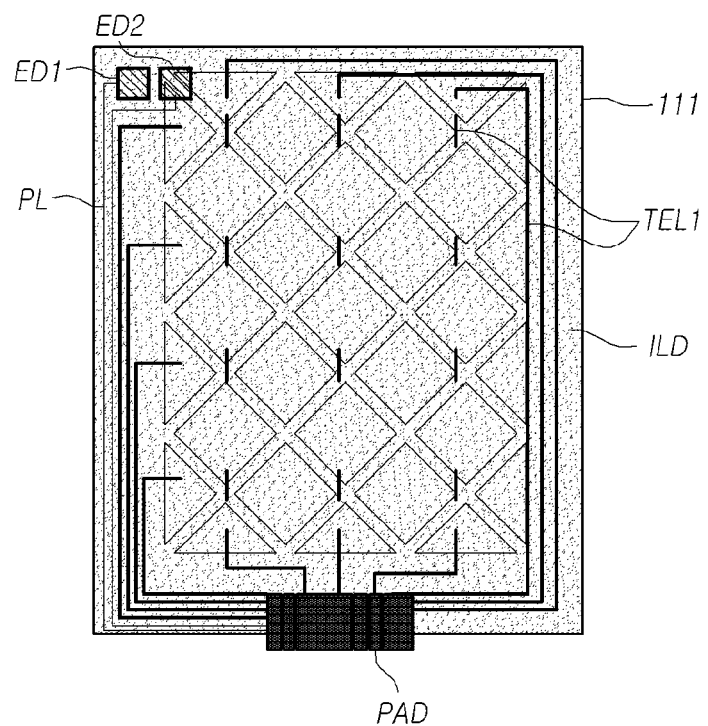

As illustrated in FIG. 9C, a second touch electrode line TEL2 may be disposed on the insulation film ILD. The second touch electrode line TEL2 may correspond to the touch electrode TE illustrated in FIG. 6. The insulation film ILD may be provided with a contact hole in a location corresponding to the connecting portion BL. The second touch electrode line TEL2 may be connected to the connecting portion BL, disposed below the insulation film ILD, through the contact hole.

Figure 9D:
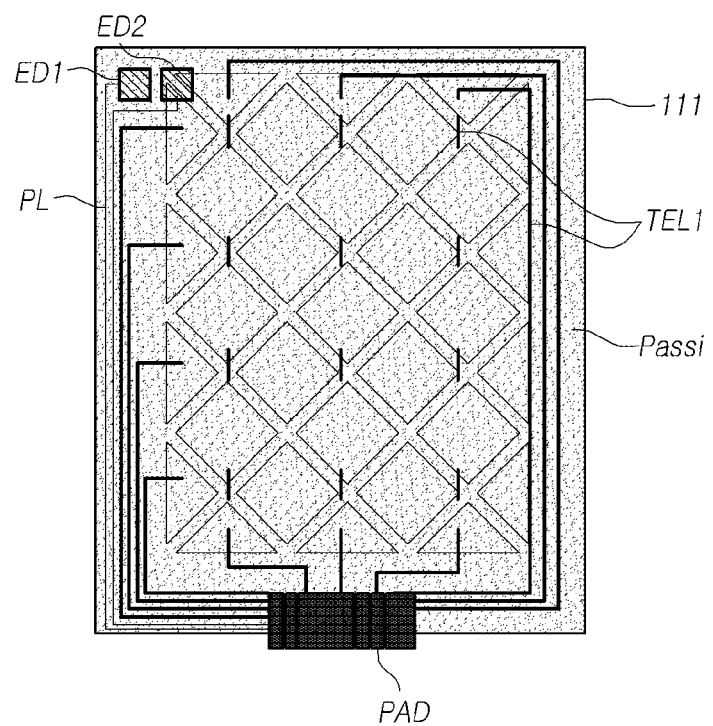

As illustrated in FIG. 9D, a planarization film Passi may be disposed on the second touch electrode line TEL2. The planarization film Passi may not be disposed on the first electrode ED1 and the second electrode ED2. Here, the planarization film Passi may be the passivation film 150b illustrated in FIG. 6.

Figure 9E:
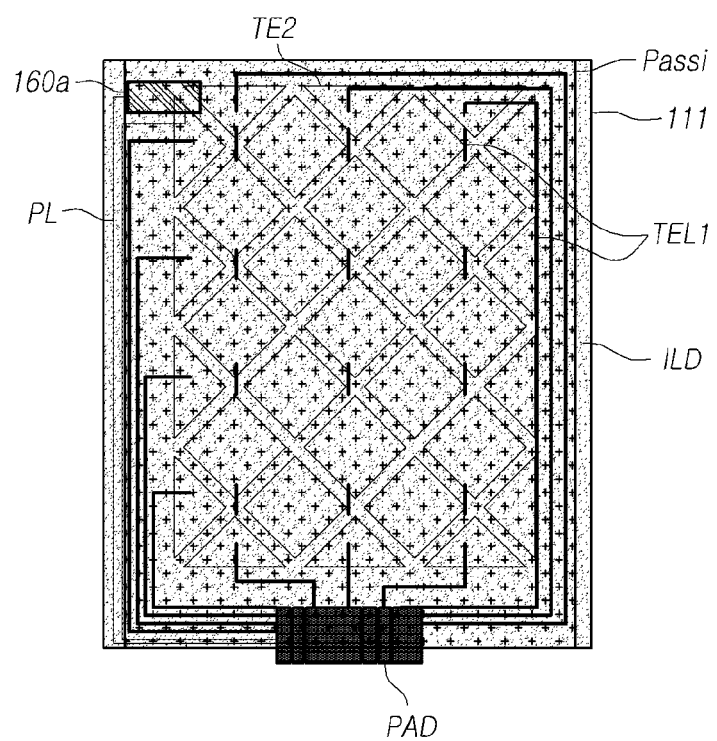

As illustrated in FIG. 9E, the light-emitting element may be disposed in a location corresponding to the first electrode ED1 and the second electrode ED2. The light-emitting element 160a may include a p-type electrode connected to the first electrode ED1, and an n-type electrode connected to the second electrode ED2. However, the present disclosure is not limited thereto. The light-emitting element 160a may be disposed on the substrate 111 by a transfer process. In addition, the light-emitting element 160a may be disposed in the non-pixel area in which the touch electrode TE is not disposed.

Figure 10:
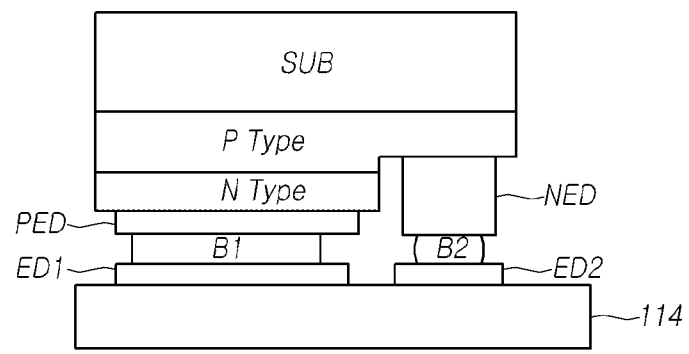
FIG. 10 is a cross-sectional view illustrating an example of the light-emitting element disposed on the encapsulation layer.

FIG. 10 is a cross-sectional view illustrating an example of the light-emitting element disposed on the encapsulation layer according to aspects.

Referring to FIG. 10, the light-emitting element may include a p-type semiconductor and an n-type semiconductor sequentially stacked on a growth substrate SUB. A p-type electrode PED may be connected to the p-type semiconductor and an n-type electrode NED may be connected to the n-type semiconductor. Bonding agents B1 and B2 are disposed on the P-type electrode PED and the n-type electrode NED, respectively. The first electrode ED1 and the second electrode ED2, having been disposed on the encapsulation layer 114 of the display panel 110, may be fixedly connected to the p-type electrode PED and the n-type electrode NED through the bonding agents B1 and B2, respectively. The growth substrate SUB may comprise an aluminum oxide. In addition, the p-type semiconductor and the n-type semiconductor may each comprise gallium arsenide (GaAs). However, the present disclosure is not limited thereto.

Figure 11:
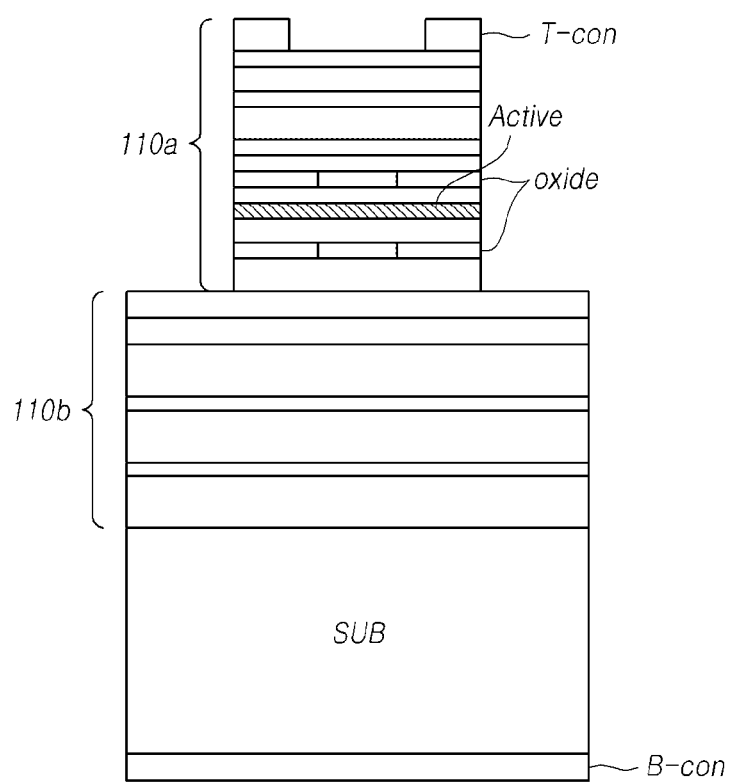
FIG. 11 is a cross-sectional view illustrating another example of the light-emitting element according to the present disclosure.

FIG. 11 is a cross-sectional view illustrating another example of the light-emitting element disposed on the encapsulation layer according to aspects.

Referring to FIG. 11, a bottom electrode B-con may be disposed on the rear surface of the growth substrate SUB, and a lower mirror layer 110b may be disposed on the upper portion of the growth substrate SUB. An upper mirror layer 110a having an active layer Active may be disposed on the lower mirror layer 110b. A top electrode T-con may be disposed on the upper mirror layer 110a.

The top electrode T-con may be provided with a hole through which light may be emitted outwardly. The growth substrate SUB may comprise an n-type semiconductor material. In addition, the growth substrate SUB may comprise gallium arsenide (GaAs). The lower mirror layer 110b may be formed by stacking an n-type aluminum gallium arsenide (AlGaAa) layer on each other. Particularly, a plurality of n-type aluminum gallium arsenide (AlGaAa) layers having different aluminum compositions may be alternately stacked on each other.

The upper mirror layer 110a may be formed by stacking p-type aluminum gallium arsenide (AlGaAa) layers on each other. Particularly, a plurality of p-type aluminum gallium arsenide (AlGaAa) layers having different aluminum compositions may be alternately stacked on each other. The number of the p-type aluminum gallium arsenide (AlGaAa) layers of the upper mirror layer 110a, stacked on each other, may be lower than the number of the n-type aluminum gallium arsenide (AlGaAa) layers of the lower mirror layer 110b, stacked on each other. Accordingly, the reflectance of the upper mirror layer 110a differs from that of the lower mirror layer 110b, thereby allowing a laser beam to be emitted through the hole of the top electrode T-con, disposed on the upper mirror layer 110a. The reflectance of the upper mirror layer 110a may be lower than that of the lower mirror layer 110b.

The active layer Active may be disposed on the lower mirror layer 110b. The active layer may comprise a gallium arsenide (GaAs). In addition, an oxide layer may be formed on both upper and lower sides of the active layer Active. The oxide layer may be formed by oxidizing the periphery of the semiconductor layer. The oxide layer may conduct a current through a non-oxidized central portion thereof. The active layer Active may have a higher refractive index than the lower mirror layer 110b and the upper mirror layer 110a.

The bottom electrode B-con may be in contact with the first electrode ED1 of FIG. 8A, disposed on the substrate 111, through a bonding agent. The top electrode T-con may be in contact with the second electrode ED2 of FIG. 8A, disposed on the substrate 111, through a connection wiring (not shown).

Figure 12:
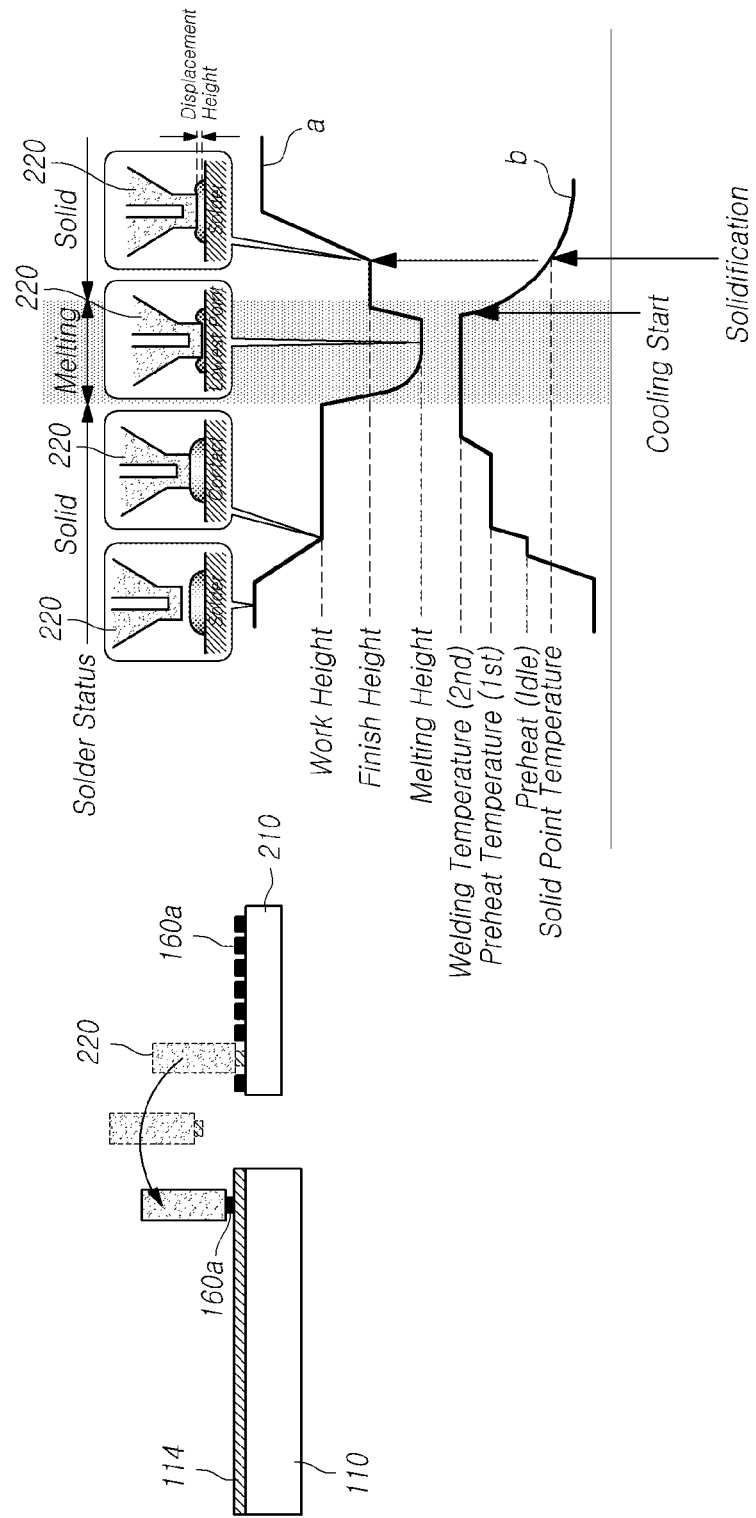
FIG. 12 is a conceptual diagram illustrating an arrangement of the light-emitting element on the display panel illustrated in FIG. 1 by a transfer process.

FIG. 12 is a conceptual diagram illustrating an arrangement of the light-emitting element on the display panel illustrated in FIG. 1 by a transfer process.

Referring to FIG. 12, the light-emitting elements 160a may be formed and disposed on the growth substrate 210. The growth substrate 210 may be a silicon wafer or a sapphire substrate. However, the present disclosure is not limited thereto. The light-emitting element 160a may be the light-emitting element as illustrated in FIG. 10 or FIG. 11. The light-emitting element 160a, having been formed on the growth substrate 210, may be transferred by a transfer device 220. The transfer device 220 may pick up the light-emitting element 160a from the growth substrate 210 and transfer the same to the display panel 110 illustrated in FIG. 3. An encapsulation layer 114 may have been previously disposed on an upper portion of the display panel 110 to which the light-emitting elements 160a are to be transferred.

A first electrode ED1 and a second electrode ED2 may be disposed on the encapsulation layer 114 in locations in which each of the light-emitting elements 160a is to be disposed. A bonding agent containing a conductive material may be disposed on the first electrode ED1 and the second electrode ED2. In addition, the transfer device 220 may have a heating function. Line a represents a change in height of the transfer device 220, and line b represents a change in temperature of the bonding agent due to heat applied by the transfer device 220.

The transfer device 220 can pick up one of the light-emitting elements 160a from the growth substrate 210 and place the picked-up light-emitting element 160a on the first electrode ED1 and the second electrode ED2 of the substrate 111 illustrated in FIG. 1. In addition, the transfer device 220 can fixedly attach the light-emitting element 160a to the first electrode ED1 and the second electrode ED2 using a bonding agent. Then, during the transfer process, the transfer device 220 can melt the bonding agent by applying heat to the bonding agent as illustrated with line b in FIG. 12 while applying pressure to the bonding agent through a change in height thereof as illustrated with line a in FIG. 12. That is, the transfer device 220 may attach the light-emitting element 160a to the first electrode ED1 and the second electrode ED2 using the heat and the pressure applied to the bonding agent. After the light-emitting element 160a is attached onto the encapsulation layer 114, the transfer device 220 can move away from the light-emitting element 160a.

Figure 13:
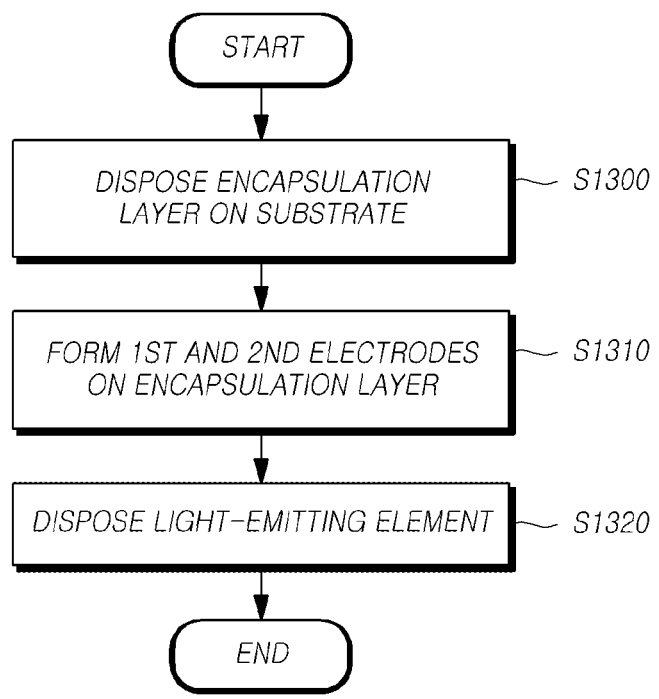
FIG. 13 is a flowchart illustrating a fabrication process of the touch display device according to the present disclosure.

FIG. 13 is a flowchart illustrating a fabrication process of the touch display device according to aspects.

Referring to FIG. 13, an encapsulation layer may be disposed on a substrate in S1300. The encapsulation layer may cover a top surface and side surfaces connected to the top surface of a light-emitting layer disposed on a substrate. As a result, the encapsulation layer can protect the light-emitting layer. The light-emitting layer may include an anode electrode, a luminescent material layer, and a cathode electrode layer, stacked on one another. The stacked anode electrode, the luminescent material layer, and the cathode electrode layer may provide the organic light-emitting diode OLED illustrated in FIG. 2.

A touch sensor, a first electrode, and a second electrode may be disposed on the encapsulation layer in S1310. The first electrode and the second electrode may transmit power. In addition, a touch sensor may be disposed on the encapsulation layer. When the touch sensor is disposed on the encapsulation layer, the first electrode and the second electrode may be disposed. Thus, the first electrode and the second electrode may be disposed on the cathode electrode layer of the light-emitting layer.

A light-emitting element may be disposed on the encapsulation layer in S1320. The light-emitting element may be disposed on the encapsulation layer by a transfer process. The light-emitting element may be disposed in a location corresponding to the first electrode and the second electrode, disposed on the encapsulation layer. The light-emitting element may operate using power supplied from the first electrode and the second electrode. After the light-emitting element is disposed on the encapsulation layer, a passivation film may be disposed on the encapsulation layer on which the touch sensor and the light-emitting element have been disposed. A polarization film may be disposed on the passivation film, an adhesive layer may be disposed on the polarization film, and a glass cover may be disposed on the adhesive layer. A light-receiving sensor may be disposed on the rear surface of the substrate.

A back plate may be disposed on the rear surface of the substrate and the light-receiving sensor may be disposed on the rear surface of the back plate. The-light-receiving sensor may include a visible light sensor and an infrared sensor. Since the light-emitting element is disposed on the cathode electrode layer, light emitted from the light-emitting element does not pass through the cathode electrode layer when the light exits the glass cover. Accordingly, light emitted from the light-emitting element can be reduced by a smaller amount. For example, when light, emitted from the light-emitting element, travels towards the light-receiving sensor after being reflected by an object on the glass cover, the amount of light reflected may be reduced due to the transmittance. However, since a greater amount of light can be reflected by the object on the glass cover, the light-receiving sensor can receive a sufficient amount of light.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A touch display device comprising:
   a display panel including a plurality of light-emitting diodes respectively including an anode electrode and a cathode electrode;
   a touch sensor disposed at a first area of the display panel;
   a light-emitting element disposed on the cathode electrode at a second area of the display panel; and
   a light-receiving sensor disposed on a rear surface of the display panel,
   wherein the display panel further includes:
   a substrate;
   an element layer disposed on the substrate and including a plurality of transistors transmitting a signal to the plurality of light-emitting diodes disposed on the element layer;
   an encapsulation layer disposed on the cathode electrode; and
   a back plate disposed on a rear surface of the substrate,
   wherein the touch sensor and the light-emitting element are disposed on the encapsulation layer,
   wherein the touch sensor includes:
   a first touch electrode line disposed on the encapsulation layer;
   an insulation film disposed on the first touch electrode line; and
   a second touch electrode line disposed on the insulation film,
   a first electrode and a second electrode disposed above or below the insulation film, on the encapsulation layer, the first and second electrodes being connected to the light-emitting element.

2. The touch display device according to claim 1, wherein the display panel includes a pixel area and a non-pixel area, the first area includes the pixel area and a first portion of the non-pixel area, and the second area is a second portion of the non-pixel area.

3. The touch display device according to claim 2, wherein a density of wirings of the second portion of the non-pixel area is lower than that of the first portion of the non-pixel area.

4. The touch display device according to claim 2, wherein the light-receiving sensor is disposed on a rear surface of a back plate corresponding to the pixel area.

5. The touch display device according to claim 1, wherein the display panel further includes:
   a polarization film disposed on the encapsulation layer; and
   a glass cover glass disposed on the polarization film, wherein the light-emitting element has a top surface that includes an area without the polarization film.

6. The touch display device according to claim 1, further comprising a touch buffer layer disposed between the encapsulation layer and the touch sensor.

7. The touch display device according to claim 1, wherein the encapsulation layer covers a top surface and side surfaces the light-emitting layer disposed on the substrate, and wherein the side surfaces are connected to the top surface.

8. A method of fabricating a touch display device, wherein the touch display device includes a light-emitting element, and a light-receiving sensor, and a substrate on which an organic light-emitting diode having an anode electrode and a cathode electrode is disposed, the method comprising:
   providing an encapsulation layer on the substrate;
   providing first and second electrodes on the encapsulation layer;
   disposing the light-emitting element connected to the first and second electrodes for supplying power to the light-emitting element; and
   disposing the light-receiving sensor on a rear surface of the substrate,
   wherein the touch display device further includes:
   a back plate disposed on a rear surface of the substrate; and
   a touch sensor is disposed on a first area of the substrate, and
   wherein the first electrode and the second electrode are disposed on a second area of the substrate.

9. The method according to claim 8, wherein the light-emitting element grown from the substrate is picked up from the substrate and is placed on the second area of the substrate by a transfer device.

10. The method according to claim 8, wherein the substrate includes a pixel area and a non-pixel area, the first area includes the pixel area and a first portion of the non-pixel area, and the second area is a second portion of the non-pixel area, and the light-emitting element is disposed in the second area.

11. The method according to claim 8, wherein the encapsulation layer covers a top surface and side surfaces of a light-emitting layer disposed on the substrate, and the side surfaces are connected to the top surface.

12. A touch display device comprising:
   a display panel including a plurality of light-emitting diodes each including an anode electrode and a cathode electrode;
   an encapsulation layer disposed on the cathode electrode
   a touch sensor including a first touch electrode line disposed on the encapsulation layer, an insulation film disposed on the first touch electrode line, and a second touch electrode line disposed on the insulation film, and the touch sensor disposed at a first area of the display panel;
   a light-emitting element disposed on the cathode electrode at a second area of the display panel;
   a light-receiving sensor disposed on a rear surface of the display panel; and
   a first electrode and a second electrode disposed on the encapsulation layer and connected to the light-emitting element for supplying power to the light-emitting element.

13. The touch display device according to claim 12, wherein the display panel includes a pixel area and a non-pixel area, the first area includes the pixel area and a first portion of the non-pixel area, and the second area is a second portion of the non-pixel area.

14. The touch display device according to claim 13, wherein the light-receiving sensor is disposed on a rear surface of the back plate corresponding to the pixel area.

15. The touch display device according to claim 12, wherein the display panel further includes:
   a polarization film disposed on the encapsulation layer; and
   a glass cover glass disposed on the polarization film, wherein the light-emitting element has a top surface that includes an area without the polarization film.

* * * * *